United States Patent [19]

Regan et al.

[11] Patent Number: 4,602,221

[45] Date of Patent: * Jul. 22, 1986

[54] HIGH FREQUENCY ENERGY SOURCE

[75] Inventors: Robert J. Regan, Needham; Scott J. Butler, Auburn; Zvi Ben-Aharon, Framingham, all of Mass.

[73] Assignee: GTE Laboratories Incorporated, Waltham, Mass.

[ * ] Notice: The portion of the term of this patent subsequent to May 22, 2003 has been disclaimed.

[21] Appl. No.: 685,430

[22] Filed: Dec. 24, 1984

[51] Int. Cl.$^4$ .............................................. H03B 5/00
[52] U.S. Cl. .......................... 331/117 R; 331/117 FE
[58] Field of Search ..................... 331/117 FE, 117 R; 330/137, 310; 3/311

[56] References Cited

U.S. PATENT DOCUMENTS 3,619,804 11/1971 Mears ........................... 331/117 FE
4,342,967 8/1982 Regan et al. ........................ 330/311

Primary Examiner—Gene Wan
Attorney, Agent, or Firm—David M. Keay

[57] ABSTRACT

Energy source of a low power high frequency oscillator section driving a high power high gain amplifier section. The amplifier section includes one or more SIT's. The dc operating potential is applied to the drain electrode of one of the SIT's and is supplied to the other through a dc path from the source electrode of the one SIT to the drain electrode of the other. Operating potential from the dc biasing network between the source and gate electrode of an SIT in the amplifier section is conducted through a dc path to a transistor in the oscillator section to provide operating power for the oscillator section. The oscillator output is connected through a high frequency coupling dc blocking path to the amplifier input to provide a drive signal to be amplified and extracted at the amplifier output.

15 Claims, 3 Drawing Figures

HIGH FREQUENCY ENERGY SOURCE

REFERENCE TO RELATED APPLICATION

This application is related to application Ser. No. 685,429 filed concurrently herewith by Zvi Ben-Aharon, Robert J. Regan, and Scott J. Butler entitled "High Frequency Power Source" and assigned to the assignee of the present application.

BACKGROUND OF THE INVENTION

This invention relates to apparatus for producing high frequency output signals. More particularly, it is concerned with solid state high frequency energy sources which employ an oscillator driving a power amplifier.

Conventional solid state high frequency power sources typically employ a low power oscillator which drives a single or multiple stage high gain amplifier. To supply dc operating power to the amplifier and the oscillator the apparatus either employs two power supplies or a single power supply having two separate power distribution networks.

One type of amplifying device which provides high gain at very high microwave frequencies is the static induction transistor (SIT), a particular type of junction field effect transistor. To obtain relatively high efficiency operation it is necessary that SIT's be operated in class B or class C conditions. In order to provide appropriate bias between the electrodes of an SIT for class B or class C operation, it is necessary either to employ a separate voltage source or a self-biasing network which adds to circuit complexity and also reduces overall efficiency.

SUMMARY OF THE INVENTION

An improved high frequency energy source in accordance with the present invention comprises an oscillator section for producing a high frequency signal at an output and an amplifier section having an input coupled to the output of the oscillator section for producing an amplified high frequency signal at an output. The amplifier section includes an amplifying device having first, second, and third electrodes and means for connecting the first electrode to a source of dc operating potential. The amplifier section also includes dc biasing means connected between the second and third electrodes for producing a dc bias voltage between them. An rf connecting means connects the output of the oscillator section to the input of the amplifier section. A dc connecting means connects the dc biasing means of the amplifier section to the oscillator section for providing operating voltage to the oscillator section from the dc biasing means. The power which would otherwise be dissipated in the dc biasing means of the amplifier section provides dc operating power to the oscillator section, the high frequency output of which provides the drive signal to the amplifier section.

For a better understanding of the present invention, together with other and further objects, advantages, and capabilities thereof, reference is made to the following disclosure and appended claims in connection with the above-described drawings.

DETAILED DESCRIPTION OF THE INVENTION

Figure 1:
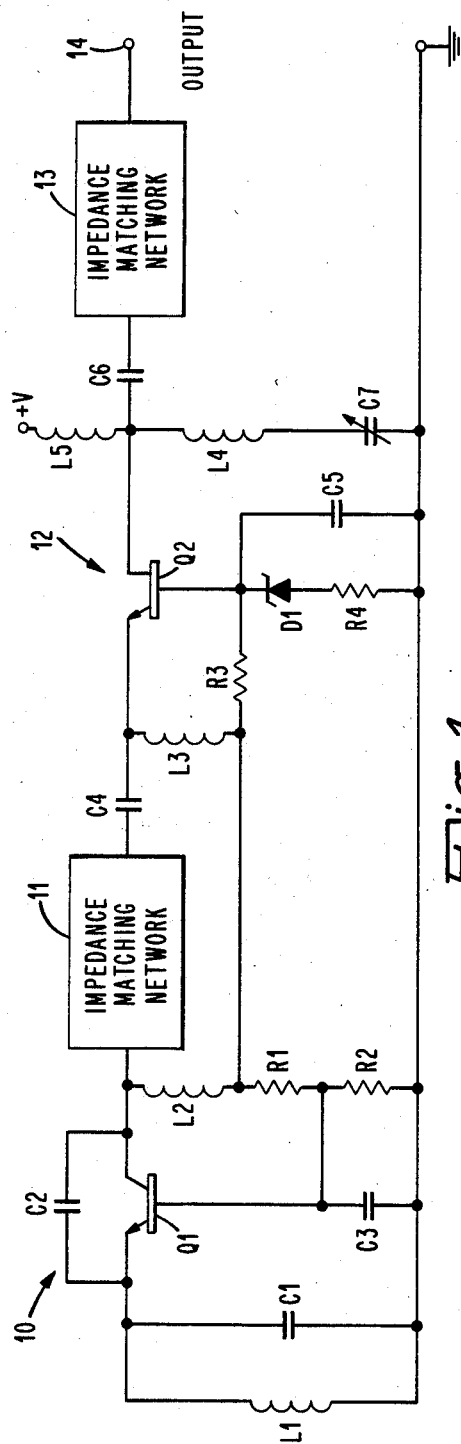
FIG. 1 is a schematic circuit diagram of a high frequency energy source in accordance with the present invention.

FIG. 1 illustrates a high frequency energy source in accordance with the present invention. The circuit includes a high frequency oscillator section 10 employing a single transistor Q1. The oscillator section generates a high frequency output signal at the output electrode of the transistor Q1. The high frequency signal is conducted through an appropriate impedance matching network 11 to an amplifier section 12. The amplifier section 12 as shown in FIG. 1 employs a single junction field effect transistor Q2 of the SIT type. The amplified high frequency signal from the amplifier section is applied through an impedance matching network 13 to an output terminal 14.

In the circuit illustrated in FIG. 1 the transistor Q1 of the oscillator section 10 is a bipolar transistor. The emitter of transistor Q1 is connected to ground through an inductance L1 and a capacitance C1 in parallel. The base is connected to ground through a capacitance C3. To provide the proper degree of feedback between the output and input of the transistor Q1 a capacitance C2 is connected between the collector and the emitter. The collector is connected to ground through an inductance L2 and a voltage divider network of resistances R1 and R2 in series. The base of the transistor Q1 is connected to the juncture of resistances R1 and R2.

The output of the oscillator section 10 is taken from the collector of transistor Q1 and applied through the impedance matching network 11 and a dc blocking capacitance C4 to the source of the SIT Q2 in the amplifier section 12. A positive dc voltage source +V is connected to the drain of the SIT Q2 by way of an rf choke or inductance L5. The gate of the SIT Q2 is connected to ground through a zener diode D1 and a resistance R4 in series and a parallel connection of a capacitance C5. An inductance L3 and resistance R3 are connected in series between the source and the gate of the SIT Q2. The juncture between the inductance L3 and resistance R3 is connected to the juncture of inductance L2 and resistance R1 of the oscillator section 10 in order to provide operating potential thereto as will be explained hereinbelow. The drain of the SIT Q2 is connected to ground through an inductance L4 and a variable capacitance C7 in series. The drain is also connected by way of a capacitance C6 and the impedance matching network 13 to the output terminal 14.

In the circuit of FIG. 1 the source of the SIT Q2 is biased positive with respect to the gate by virtue of the drain-source current flowing through the resistance R3 and the series arrangement of the zener diode D1 and resistance R4. Because of the dc biasing network the amplifier section 12 operates in an efficient class B or class C condition. In accordance with the present invention the dc biasing potential at the source of the SIT Q2 is applied to the collector of the transistor Q1 by the dc path through the rf chokes L3 and L2. Thus, a dc path is provided from the source of operating voltage +V through the SIT Q2 and through the transistor Q1 of the oscillator section 10.

The oscillator section 10 produces a high frequency output signal at the collector of the transistor Q1. This signal is coupled to the source of the SIT Q2 in the amplifier section 12 by the rf path provided by the impedance matching network 11 and capacitance C4. The high frequency signal is amplified by the amplifier section 12 and the amplifier signal is passed to the output terminal 14.

Figure 2:
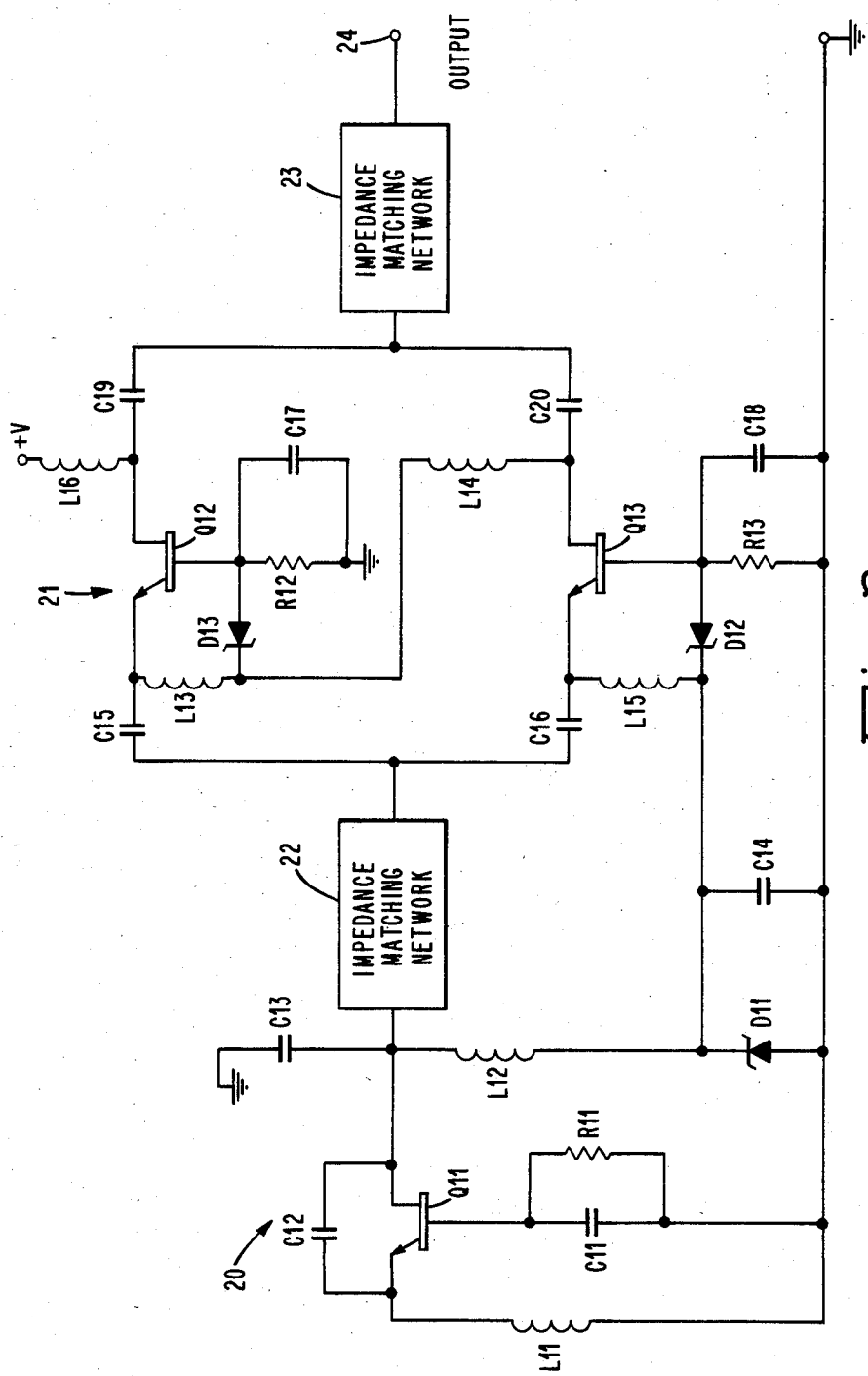
FIG. 2 is a schematic circuit diagram of another high frequency energy source in accordance with the present invention.

FIG. 2 is a circuit diagram illustrating another version of a high frequency energy source in accordance with the present invention. The circuit of FIG. 2 employs an SIT Q11 in the oscillator section 20. The amplifier section 21 employs two SIT's Q12 and Q13 connected in an amplifier arrangement of the type disclosed and claimed in application Ser. No. 604,779 filed Apr. 27, 1984, entitled "High Frequency Amplifier" by Scott J. Butler, Robert J. Regan, and Anthony B. Varallo and assigned to the assignee of the present application.

The source of the SIT Q11 in the oscillator section 20 is connected through an rf choke 11 to ground and the gate is connected to ground through a capacitance C11 and resistance R11 in parallel. A feedback capacitance C12 is connected between the source and drain. The drain of SIT Q11 is connected through a capacitance C13 to ground and through an inductance L12 and a zener diode D11 in series to ground. This arrangement provides an oscillator which is a modified Colpitts type oscillator. The output of the oscillator section is taken at the drain of SIT Q11 through an impedance matching network 22 to the sources of SIT's Q12 and Q13 of the amplifier section 21 by way of capacitances C15 and C16, respectively.

The amplifier section 21 includes the two SIT's Q12 and Q13 connected in series to a single power source +V so as to provide a single dc path through the SIT's. The SIT's provide two parallel rf paths for amplifying the high frequency signal in accordance with the teachings of the aforementioned previously filed application. The dc source of operating potential +V is connected to the drain of SIT Q12 through an rf choke or inductance L16. The gate of SIT Q12 is connected to ground through a resistance R12 in parallel with a capacitance C17. The source and gate of SIT Q12 are connected by an inductance L13 and a zener diode D13. The juncture of the inductance L13 and zener diode D13 is connected by an inductance L14 to the drain of SIT Q13. The gate of SIT Q13 is connected to ground through a resistance R13 in parallel with a capacitance C18. The source is connected to the gate through an inductance L15 and a zener diode D12.

The amplified output signals from the SIT's Q12 and Q13 are taken from their drains by way of capacitances C19 and C20, respectively, through an impedance matching network 23 to an output terminal 24. Operating potential for to the oscillator section 20 is taken from the source of SIT Q13 by way of inductance L15 and L12.

Figure 3:
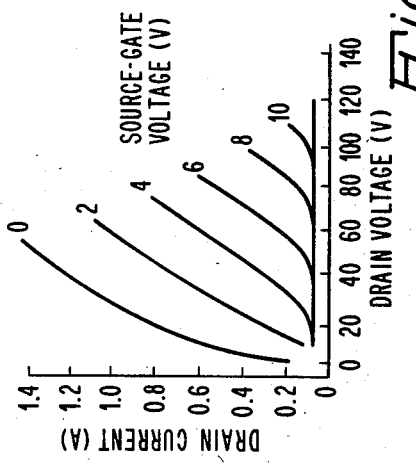
FIG. 3 illustrates operating characteristic curves of static induction transistors employed in the circuit of FIG. 2.

A specific embodiment of the high frequency energy source illustrated in FIG. 2 was constructed employing the following components:

| | |
|---|---|
| Q11, Q12, and Q13 | GTE Laboratories Incorporated 09-140-25 EXP 7 μm pitch SIT's FIG. 3 illustrates the operating characteristic curves. |
| D11 | 40 volt zener diode |
| D12 and D13 | 7.5 volt zener diode |
| R11 and R13 | 10kΩ |
| R12 | 50kΩ |
| L11, L12, L13, L14, L15, and L16 | .39 μH |
| C11, C17, and C18 | 94 pf |
| C12 | 1.9 pf |
| C13 | 2.2 pf |
| C14 | 1000 pf |
| C15, C16, C19, and C20 | 47 pf |
| Impedance Matching Networks 22 and 23 | Triple stub tuners |
| +V | 170 volts |

The frequency of the output signal at the output terminal 24 was 917 MHz with a power output of 18.3 watts. Overall circuit efficiency; that is, rf output power to dc input power, was 40%.

Thus, high frequency energy sources in accordance with the present invention combine a high frequency low power oscillator and a high gain power amplifier so as to provide relatively efficient operation. Power is not dissipated in the dc biasing network of the amplifier as would otherwise be the case under class B or class C conditions. No power supplies other than a single dc voltage source are required and the circuitry is relatively uncomplicated.

While there has been shown and described what are considered preferred embodiments of the present invention, it will be obvious to those skilled in the art that various changes and modifications may be made therein without departing from the invention as defined by the appended claims.

What is claimed is:
1. A high frequency energy source comprising
   an oscillator section for producing a high frequency signal at an output;
   an amplifier section having an input coupled to the output of the oscillator section for producing an amplified high frequency signal at an output;
   said amplifier section including
      an amplifying device having first, second, and third electrodes,
      means for connecting the first electrode to a source of dc operating potential, and
      dc biasing means connected between the second and third electrodes for producing a dc bias voltage therebetween;
   rf connecting means connecting the output of the oscillator section to the input of the amplifier section; and
   dc connecting means connecting said dc biasing means of the amplifier section to the oscillator section for providing operating voltage to the oscillator section from said dc biasing means.
2. A high frequency energy source in accordance with claim 1 wherein
   said rf connecting means includes dc blocking means; and
   said dc connecting means includes rf blocking means.
3. A high frequency energy source in accordance with claim 2 wherein
   said means for connecting the first electrode of the amplifying device to a source of dc operating potential includes rf blocking means.
4. A high frequency energy source in accordance with claim 3 wherein said dc biasing means biases said amplifying device between the second and third electrodes to cause conduction within the amplifying device.

5. A high frequency energy source in accordance with claim 4 wherein
said amplifying device is a static induction transistor; and
the first electrode is a drain electrode, the second electrode is a source electrode, and the third electrode is a gate electrode.

6. A high frequency energy source comprising an output connection;
an oscillator section for producing a high frequency signal including an oscillator transistor having first, second, and third electrodes;
an amplifier section coupled to the oscillator section for producing an amplified high frequency signal;
said amplifier section including
an amplifier transistor having first, second, and third electrodes,
means for connecting the first electrode of the amplifier transistor to a source of dc operating potential,
dc biasing means connected between the second and third electrodes of the amplifier transistor for producing a dc bias voltage therebetween, and
output means including dc blocking means coupling the first electrode of the amplifier transistor to said output connection;
dc connecting means including rf blocking means coupling the second electrode of the amplifier transistor to the first electrode of the oscillator transistor whereby a dc conductive path is provided from the source of operating potential through the amplifier transistor to the oscillator transistor; and
rf connecting means including dc blocking means coupling the first electrode of the oscillator transistor to the second electrode of the amplifier transistor whereby an rf conductive path is provided.

7. A high frequency energy source in accordance with claim 6 wherein
said means for connecting the first electrode of the amplifier transistor to a source of operating potential includes rf blocking means.

8. A high frequency energy source in accordance with claim 7 wherein
said amplifier transistor is a field effect transistor; and
said first electrode is a drain electrode, said second electrode is a source electrode, and said third electrode is a gate electrode.

9. A high frequency energy source in accordance with claim 7 wherein
said amplifier transistor is a static induction transistor; and
said first electrode is a drain electrode, said second electrode is a source electrode, and said third electrode is a gate electrode.

10. A high frequency energy source comprising an output connection;
an oscillator section for producing a high frequency signal including an oscillator transistor having first, second, and third electrodes;
an amplifier section coupled to the oscillator section for producing an amplified high frequency signal;
said amplifier section including
first and second amplifier transistors each having first, second, and third electrodes,
means for connecting the first electrode of the first amplifier transistor to a source of dc operating potential,
first dc biasing means connected between the second and third electrodes of the first amplifier transistor for producing a dc bias voltage therebetween,
rf blocking means connecting the second electrode of the first amplifier transistor to the first electrode of the second amplifier transistor,
second dc biasing means connected between the second and third electrodes of the second amplifier transistor for producing a dc bias voltage therebetween, and
output means including dc blocking means coupling the first electrode of the first amplifier transistor and the first electrode of the second amplifier transistor to said output connection;
dc connecting means including rf blocking means coupling the second electrode of the second amplifier transistor to the first electrode of the oscillator transistor whereby a dc conductive path is provided from the source of operating potential through the first amplifier transistor and the second amplifier transistor in series to the oscillator transistor; and
rf connecting means including dc blocking means coupling the first electrode of the oscillator transistor to the second electrode of the first amplifier transistor and to the second electrode of the second amplifier transistor whereby rf conductive paths are provided.

11. A high frequency energy source in accordance with claim 10 wherein
said means for connecting the first electrode of the first amplifier transistor to a source of dc operating potential includes rf blocking means.

12. A high frequency energy source in accordance with claim 11 wherein
said first and second amplifier transistors are field effect transistors; and
said first electrodes are drain electrodes, said second electrodes are source electrodes, and said third electrodes are gate electrodes.

13. A high frequency energy source in accordance with claim 11 wherein
said first and second amplifier transistors are static induction transistors; and
said first electrodes are drain electrodes, said second electrodes are source electrodes, and said third electrodes are gate electrodes.

14. A high frequency energy source in accordance with claim 13 wherein
said dc blocking means include capacitances; and
said rf blocking means include inductances.

15. A high frequency energy source in accordance with claim 14 wherein
said first dc biasing means includes a voltage reference diode connected between the source and gate electrodes of the first amplifier transistor; and
said second dc biasing means includes a voltage reference diode connected between the source and gate electrodes of the second amplifier transistor.

* * * * *